United States Patent [19]
Lim

[11] Patent Number: 5,244,836
[45] Date of Patent: Sep. 14, 1993

[54] METHOD OF MANUFACTURING FUSIBLE LINKS IN SEMICONDUCTOR DEVICES

[75] Inventor: Sheldon C. P. Lim, Sunnyvale, Calif.

[73] Assignee: North American Philips Corporation, New York, N.Y.

[21] Appl. No.: 814,938

[22] Filed: Dec. 30, 1991

[51] Int. Cl.$^5$ .................................... H01L 21/44
[52] U.S. Cl. .............................. 437/192; 437/922; 148/DIG. 131
[58] Field of Search ............. 148/DIG. 131, DIG. 55; 156/625; 437/189, 190, 192, 921, 922

[56] References Cited

U.S. PATENT DOCUMENTS

| | | | |
|---|---|---|---|
| 4,491,860 | 1/1985 | Lim | 357/68 |
| 5,011,791 | 4/1991 | Mastroianni | 437/922 |
| 5,015,604 | 5/1991 | Lim et al. | 437/922 |
| 5,017,510 | 5/1991 | Welch et al. | 437/192 |
| 5,120,679 | 6/1992 | Boardman et al. | 437/922 |

FOREIGN PATENT DOCUMENTS 0278250  11/1988  Japan ........................ 148/DIG. 55

*Primary Examiner*—Brian E. Hearn
*Assistant Examiner*—C. Chaudhari
*Attorney, Agent, or Firm*—Paul R. Miller

[57] ABSTRACT

The present invention provides a method of forming fuse ribbons between conductive layers on a semiconductor device. The formation of these fuse ribbons may be at different levels of multiple level integrated circuits. The fuse ribbons are formed in a more precise manner than can be obtained conventionally. Resistance control can be easily achieved and significant decreases in dimensions and the use of less fuse material can be achieved.

14 Claims, 4 Drawing Sheets

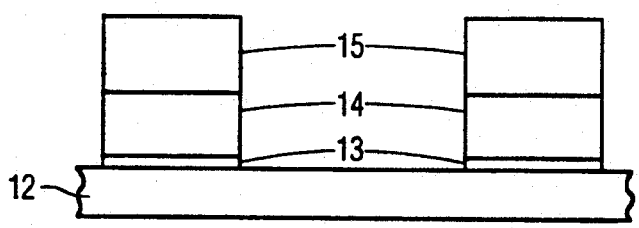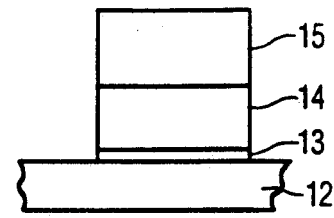
FIG. 5A  FIG. 5B
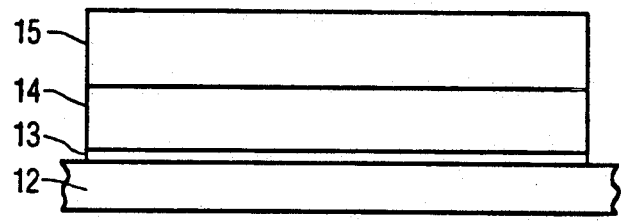
FIG. 5C
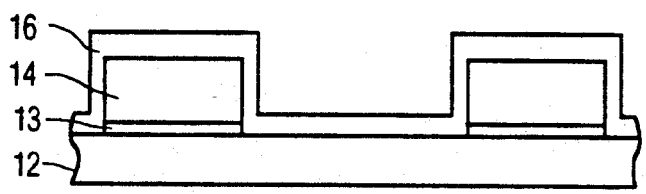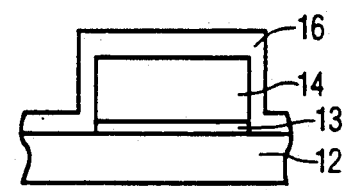
FIG. 6A  FIG. 6B
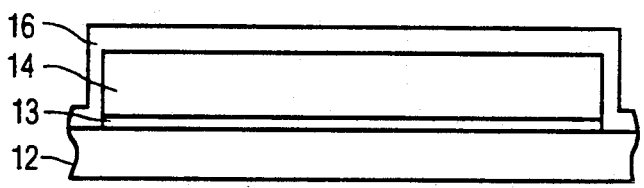
FIG. 6C
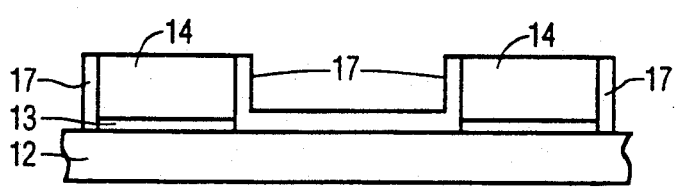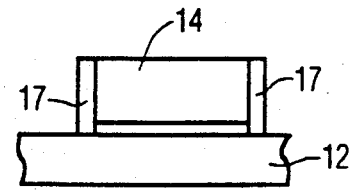
FIG. 7A  FIG. 7B
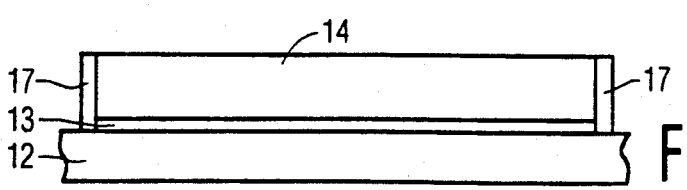
FIG. 7C

METHOD OF MANUFACTURING FUSIBLE LINKS IN SEMICONDUCTOR DEVICES

The present invention involves a method of making fusible links in integrated circuits. In particular, the present invention provides a technique for enabling better control of fuse resistance, as well as permitting use of different, suitable fuse materials.

BACKGROUND OF THE INVENTION

In the manufacture of programmable bipolar circuits, such as PROM's, PLA's, PML's, and other PLD's, metallic fusible links are used as the programming elements. Historically, such fuses are fabricated from a sequence of metal depositions, maskings and etches followed by an interconnect deposition and photolithography. Recently, such fuses have been combined with barrier metal at the surface of semiconductor devices to form part of the interconnect. The sequence of formation is deposition of the barrier metal, deposition of the conductive metal, masking for the interconnect pattern, etching the conductive metal, stripping the resist, then remasking for the fuse pattern and etching the exposed barrier metal.

Also, processes have been devised using a somewhat different method for fuse fabrication in order to allow plasma etching of conductive layers, such as aluminum, for tighter interconnect pitches since dry etching of aluminum would etch into any fuse materials being formed of the same material as the barrier metal. In this sequence, after the barrier metal and conductive metal are deposited, a combined interconnect and fuse mask is used and the conductive layer and barrier layer are sequentially etched. Another mask that has an oversized hole is then applied and the conductive metal is wet etched to remove it from the fuse material.

For all of these techniques, fuse resistance is a complicated function of sheet resistance and fuse dimensions or width and length. Sheet resistance, which is resistivity divided by thickness, and fuse length are usually well controlled. However, fuse width is usually very narrow, especially for metals of TiW in order to meet circuit requirements for fuse resistance. This is because the TiW must also be sufficiently thick to serve as the barrier metal. Thus a critical dimension control is needed, but this pushes photolithography to the limits. Exposure and development is very critical as is the etch process, both for conductive metal, such as aluminum, as well as for fuse material of TiW.

SUMMARY OF THE INVENTION

The present invention enables a better control of fuse resistance, as well as allows the use of other more suitable fuse materials. The starting point for the present invention is after fabrication of a semiconductor device, including transistors, diodes, resistors, or etc., and then contact openings to the device are defined. The invention may be implemented at any of several levels of interconnection including an initial level of a vertical semiconductor integrated circuit or any subsequent levels.

Thus, the method of the present invention manufactures fusible links between conductors in a semiconductor device by the steps of fabricating a semiconductor device having a surface on at least one level with contact positions for conductors, depositing at least a conductive metal layer on the surface to a given thickness, forming a first masking pattern over the conductive metal with openings to define a pattern of conductive interconnects, etching the conductive metal layer through the openings of the first masking pattern, removing the first masking pattern, depositing a fuse material over the pattern of conductive interconnects to a second given thickness, anisotropically etching the fuse material to form ribbons of the fuse material at side edges of the pattern of conductive interconnects, forming a second masking pattern over the pattern of conductive interconnects and ribbons of fuse material where the second masking pattern has openings at positions to specifically locate ribbons of the fuse material, etching exposed portions of the pattern of conductive interconnects to leave only the ribbons of fuse material, and removing the second masking pattern.

This technique achieves the formation of fusible links in semiconductor devices in a significantly improved manner over that of the prior art.

In the formation of the conductive metal layer, a barrier metal, such as TiW, may be formed followed by the conductive metal layer, of an aluminum alloy, such as AlCu, for example. These layers include the interconnect conductive material. In particular, the present invention is independent of the choice of materials for either the barrier metal or the conductive interconnects as long as the etch of the fuse material does not substantially affect the interconnect or vice versa. Barrier metal is generally not used at subsequent or higher interconnect levels in a vertical structure, and conductive layers of aluminum alloy may be of the same or thicker thicknesses depending on current density or resistance requirements. It is common, however, to use both the conductive material layer and the barrier layer for the initial interconnect layer. The use of the barrier metal at the first level of interconnect depends on the type of interconnect material, the junction depth of the devices or the contact opening size. However, it is ordinarily expected that state of the art integrated circuits will require barrier metal at the first level of interconnect.

During the etching of the conductive metal layer, a plasma or dry etch may be carried out, but sometimes where the barrier layer is used, a partial dry etch followed by a wet etch is used to completely etch the barrier layer. For example, aluminum may be etched in a chlorine based plasma which also partially etches TiW. Complete etching of TiW in a plasma can be accomplished by switching to a fluorine based plasma. Such a fluorine based plasma is usually necessary after aluminum etches in order to displace chlorine from the photoresist in order to avoid subsequent corrosion of aluminum upon removal from the etching process. Wet etching of TiW is typically done in a 30% hydrogen peroxide solution.

The deposition of fuse material is not critical and can be carried out by various techniques. The deposition technique need only to have the capability of depositing the fuse material along the side walls of the conductive pattern or interconnect. Commonly used techniques include physical vapor deposition (PVD) techniques, such as evaporation or sputtering; chemical vapor deposition (CVD), both atmospheric or low pressure; or plasma enhanced CVD (PECVD). Electroless plating is also possible for deposition, and this produces selective depositions on the interconnects only.

Examples of the fuse material include nickel, nickel-chromium, chromium, tungsten, tungsten-nitride, titanium-tungsten, titanium-tungsten-nitride, titanium, or titanium nitride. In general the fuse materials can be any conductor that will not subsequently be affected by the later etching of the aluminum interconnect or of a TiW barrier layer.

Nominal thicknesses of the fuse material would be in the range of 500 to 4000 angstroms depending on: the resistivity of the chosen fuse materials, the thickness of both the barrier layer and conductive layer, the lateral length of separation between interconnects, the ratio of lateral thicknesses along the interconnects' side walls to the nominal vertical thickness of the fuse material where the deposited film is parallel to the substrate, and the desired resistance of the fuses. The lateral thickness along the side walls may be 30% to 100% of the nominal thickness depending on the deposition technique, the height of the interconnects, and the space between the adjacent interconnects.

Anisotropic etching of the fuse material is carried out so that etching in the vertical direction is faster than in the lateral direction. A commonly used etch technique for such anisotropic etching is plasma etching or reactive ion etching (RIE) because the reactive ions arrive at the material to be etched in a vertical direction. The ions chemically react with the material to form gaseous or volatile end products. Materials that cannot be readily plasma etched because of the lack of appropriate reacting species to form a volatile end product can be etched by ion milling. The technique of ion milling uses inert ions, such as Ar+, to physically remove by sputtering away the material (somewhat like sandblasting) rather than by chemical reactions.

A plasma etch has the advantage that it can be tailored to be more specific to etch desired materials and not overly etch into the interconnects, for example of aluminum or aluminum alloy. Both plasma etches and ion milling allow the use of end point detection techniques to stop etching at the appropriate time in order to minimize etching into other materials. Time etching can also be done if the etch rates have been previously determined. End point detection techniques may involve the use of mass spectrometry or light emission type spectroscopy.

In the further formation of the fuses, a mask pattern may be provided to give an oversized opening at the portion where the fuses are desired to be located. Subsequent removal of the conductive metal from the combined conductive interconnect and fuse material forms fuse ribbons. This can be easily carried out by etching with mixtures of phosphoric acid, nitric acid and acetic acids which are commonly used for etching aluminum. Various commercially available and proprietary formations of these mixtures exist.

In the case of using a barrier metal, the barrier metal needs to be etched upon exposure after etching the aluminum or conductive interconnect. This again must be done substantially without affecting the fuse ribbons. An etch with hydrogen peroxide easily etches barrier metals such as TiW. An anisotropic dry etching or plasma etching can also be done since the thickness of the TiW in the horizontal direction is much less than the effective thickness vertically of the fuse ribbon. Because of this, it is also possible to use TiW as a fuse material in combination with a dry etch or plasma etch. Use of hydrogen peroxide for etching the barrier metal would overly etch any TiW fuse ribbons since the etching takes place isotropically.

If multiple levels of interconnects are to be provided with fuse ribbons, then there are various additional steps employed after formation of fuse ribbons at the first or at intermediate levels of interconnect, and additional steps of dielectric deposition, planarization, via patterning, metal depositions, and interconnect patterning still must be done. The formation of fuse ribbons at each interconnect level, if desired, is provided according to the present invention. Further, if the invention is employed at a final interconnect level, then deposition of a passivation layer, such as silicon nitride, and the further patterning of the passivation layer must be done.

BRIEF DESCRIPTION OF THE DRAWING FIGURES

The invention is clearly described in detail by way of example with reference to the following drawing figures. Therein:

Figure 2:
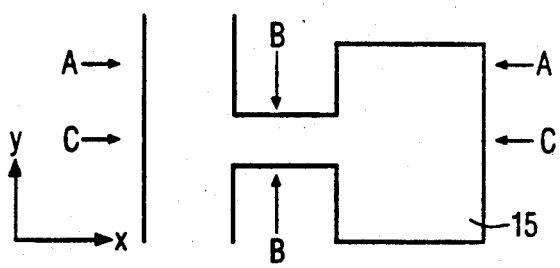
FIG. 2 shows in plane view an arrangement according to the present invention.
Figure 3A:
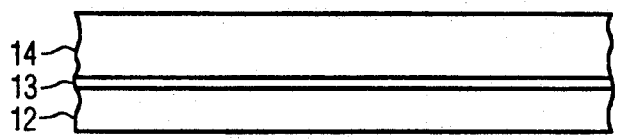
Figure 3B:
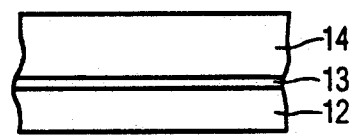
Figure 3C:
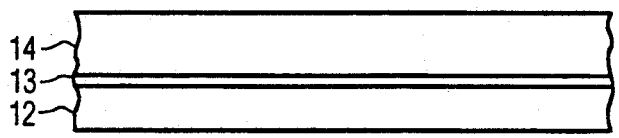
Figure 4A:
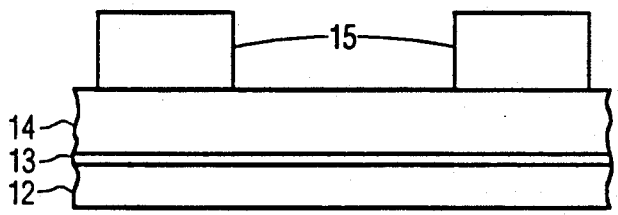
Figure 4B:
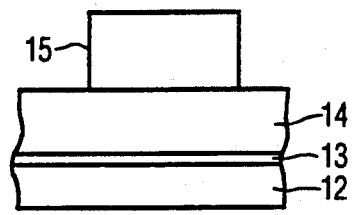
Figure 4C:
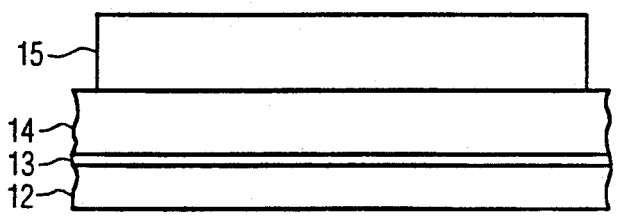
Figure 8:
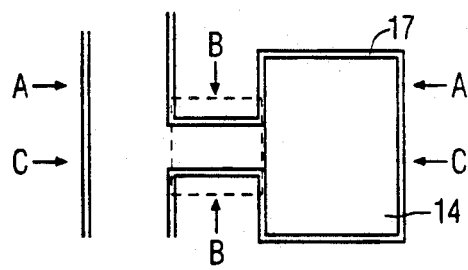
Figure 9A:
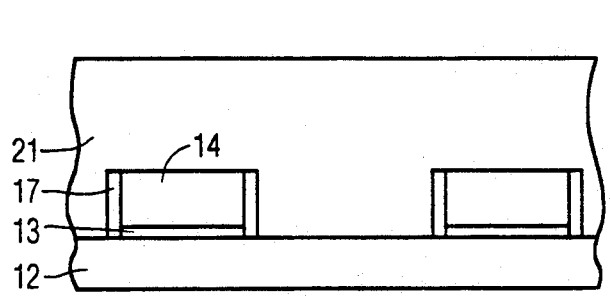
Figure 9B:
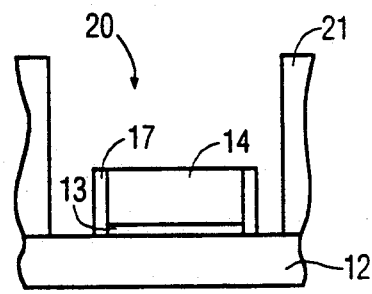
Figure 9C:
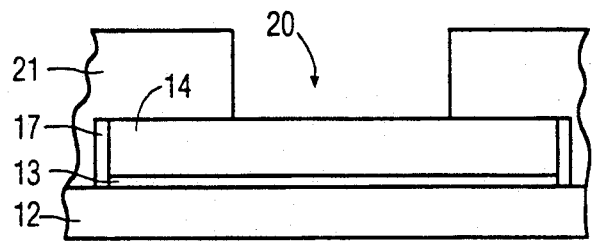
Figure 10:
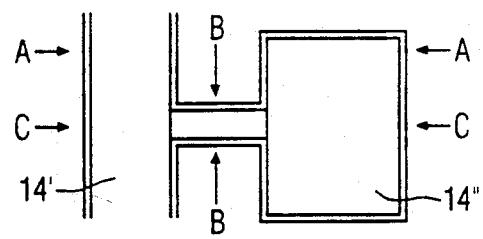
Figure 11A:
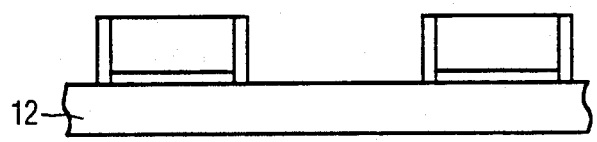
Figure 11B:
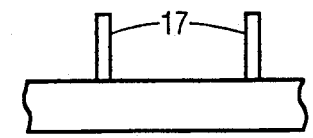
Figure 11C:
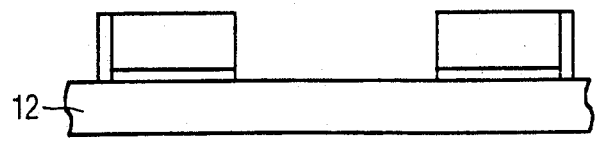

FIGS. 3A, 3B, and 3C show cross-sectional views of an initial arrangement to form FIG. 2 at the respective cross-sections A—A, B—B, and C—C;

FIGS. 4A, 4B, and 4C show in cross-section a next stage of the method according to the present invention upon applying a mask;

FIGS. 5A, 5B, and 5C show in cross-section the next stage of the method according to the present invention;

FIG. 6A, 6B, and 6C show in cross-section the application of fuse material in the present invention;

FIG. 7A, 7B, and 7C show in cross-section a subsequent stage of the present invention;

FIG. 8 shows in plane view the use of another mask in the present invention;

FIGS. 9A, 9B, and 9C show in cross-section the arrangement in FIG. 8 as shown along the lines A—A, B—B, and C—C;

FIG. 10 shows in plane view a final stage of the method of the present invention; and FIGS. 11A, 11B, and 11C show in cross-section arrangements of the present invention through the lines A—A, B—B, and C—C in FIG. 10.

DESCRIPTION OF THE INVENTION

Figure 1:
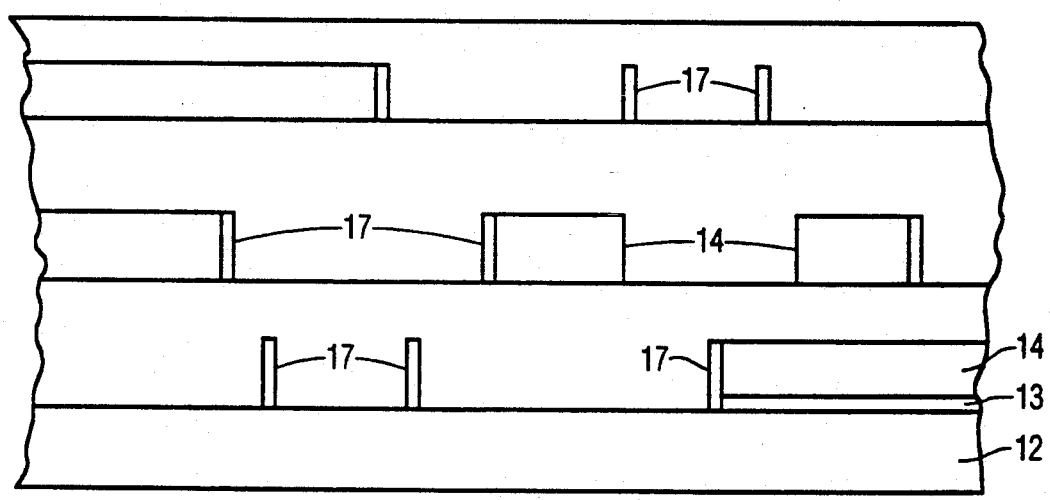
FIG. 1 shows in cross sectional view a stacked structure of various layers of interconnects having fuse ribbons according to the present invention.

The general structure to which the presently claimed invention may be applied for preparing fuse connection is illustrated in FIG. 1. This Figure shows different vertical stages of a semiconductor device, having respective interconnects at each level. The formation of metallic fusible links is relevant to numerous solid state integrated circuits such as used in integrated circuit devices for computers.

In FIG. 1, three levels of interconnect are shown with each level showing conductive metal layer portions 14 and fuse ribbons 17. The first and third levels show the fuse ribbons 17 being perpendicular to the plane of the drawing while the second level shows the fuse ribbons on the sides of the metal 14 and parallel to the plane of the drawing similar to that shown in FIG. 11C. Also the number of fuse ribbons at any one level may be varied according to the type of device or structure.

Each level of the semiconductor device represents the starting point for the present invention. In this case, the devices of the integrated circuit, consisting of transistors, diodes, resistors, etc., have been fabricated and contact openings to them have been defined. At each level of the interconnects, a plane view of the conductors may be seen, for example, in FIG. 2.

FIG. 2 shows the general appearance of a pattern that occurs upon application of a photoresist mask layer 15 at a surface or level of the semiconductor device. In this example, the pattern is in the general shape of H.

Cross-section A—A shows the cross-section above the cross bar of the H pattern. Cross-section C—C is through the cross bar of the H pattern in the x direction, while cross-section B—B is through the cross bar in the y direction. This invention is not limited to such an H pattern, but it is one that can show the present invention. Fusible links provided according to the present invention can connect conductors of any desired shape.

Upon using the present invention at the first level of interconnects, barrier metal 13 such as TiW of 1000-2000 angstrom thicknesses is deposited over a substrate 12 that contains the semiconductor devices. Thereafter, a conductive metal layer 14, such as aluminum alloy of, for example, AlCu of 3000 to 8000 angstroms thickness, is applied over the barrier metal layer 13 for the interconnect material, such as seen in FIGS. 3A-3C. These thicknesses are selected according to the technology to be made or any appropriate design considerations and are not critical to the present invention.

The invention is also independent of the choice of materials for the barrier metal and the interconnect conductors, as long as the etch of the fuse material does not substantially affect the interconnect, or vice versa. At subsequent interconnect levels, a barrier metal is generally not used, and the conductive metal layer may have the same or greater thickness depending on current density or resistance requirements of the structure being formed.

The deposition technique for the conductive metal layer of aluminum alloy, for example, and the TiW barrier layer is not significant for the present invention. Presently, both materials are commonly sputter deposited. Barrier metal is also an option for the first level of interconnects depending on the junction depth of the devices or the contact opening size. However, it is expected from state of the art circuits that barrier metals will be required at the first level of interconnects.

Following the application of the layer of barrier metal 13 and conductive layer 14, a masking material, such as a positive photoresist with selected exposure to light by means of a mask or reticle in an aligner/stepper, is applied over the conductive metal layer 14. This photoresist is patterned to form the mask 15, as shown in FIGS. 4A, 4B, and 4C.

After formation of this mask 15, the conductive metal and barrier metal are etched, as shown in FIGS. 5A, 5B, and 5C. This etching is usually carried out by a plasma or dry etching technique of both materials, but when using a TiW barrier metal, the barrier metal is sometimes partially dry etched and then wet etched to completion. The conductive layer of aluminum alloy is etched in a chlorine based plasma which also can partially etch the barrier metal of TiW. Complete etching of the TiW in a plasma can be accomplished by switching to a fluorine based plasma which is usually necessary after an aluminum alloy etch anyway. This is for displacement of chlorine from the photoresist to avoid subsequent aluminum corrosion upon removal from the etching machine. Wet etching of the barrier metal TiW is typically done in a 30% hydrogen peroxide solution.

After removal of the photoresist by a commercially available wet stripping agent or in an oxygen plasma or combination of both, a fuse material 16 is then deposited over the pattern of conductive layer and barrier layer. The deposition technique is not critical since it only needs to have the capability of depositing fuse material on the side walls. Deposition of such fuse material 16, as shown in FIGS. 6A, 6B, and 6C, may be carried out by a physical vapor deposition (PVD) technique, such as evaporation or sputtering, chemical vapor deposition (CVD) both at atmospheric or low pressure, or plasma enhanced CVD (PECVD). Electroless plating is also possible for such deposition since it can produce selective deposits on the interconnect only. The fuse material may be nickel, nickel-chromium alloy, chromium, tungsten, tungsten nitride, titanium, titanium-tungsten, titanium-tungsten-nitride, or titanium nitride. In general, the fuse material may be any conductor that will not be substantially affected by the later etching of the conductive metal, such as aluminum alloy, or the barrier metal, such as TiW.

Nominal thickness of the fuse material 16 would be selected in the range of 500 to 4000 angstroms, depending on the chosen fuse material, its resistivity, the height of the barrier metal plus conductive metal, the lateral length of the crossbar of the H pattern, the ratio of lateral thickness of the side walls to the nominal vertical thickness where the deposited metal is parallel to the substrate, and the desired resistance of the fuses as determined by the device to be manufactured. The lateral thickness of the side walls may be 30% to 100% of the nominal vertical thickness depending on the deposition technique, the height of the interconnects, and the spacing between portions of the interconnects.

The fuse material is then anisotropically etched so that the etch in the vertical direction is faster than in the lateral direction. A commonly used etch method which is anisotropic is plasma etching or reactive ion etching (RIE) because the reactive ions arrive at the material to be etched in a vertical direction. The ions chemically react with the material to form gaseous or volatile end products. Materials that cannot be readily plasma etched because of the lack of appropriate reacting species to form a volatile end product may be etched by an ion milling technique. Ion milling uses inert ions, such as Ar+, to physically remove, by sputtering away, the material rather than by chemical reaction.

A plasma etch has the advantage that it can be tailored to be more specific to etch the desired material and not overly etch into, for this example, the conductive layer portion 14 of aluminum. Both plasma etch and ion milling allow the use of end point detection techniques to stop the etching in order to minimize etching into other materials than that to be etched. Time etching can also be used if the etch rates are previously determined.

In this example, titanium nitride, TiN, can be plasma etched in a fluorine based plasma and tungsten, W, can be plasma etched in a chlorine plasma. Since chlorine plasma also etches aluminum, end point detection would be necessary. Various end point techniques are well known and one such method is to monitor with a mass spectrometer when the amount of tungsten chloride decreases or the amount of aluminum chloride increases. End point detection by light emission type spectrometry is also possible. For fuse materials of nickel-chromium, nickel or chromium, ion milling may be needed, again with end point detection or controlled time etching.

Such anisotropic etching of the fuse material results in the presence of fuse ribbons 17, as may be seen in FIG. 7A, 7B and 7C. These fuse ribbons 17 occur along the side walls of the conductive material 14 or conductive/barrier material 14/13. The ribbons occur because the effective thickness of the fuse material along the side walls appears much greater to the vertically directed ions in the anisotropic etching than the thickness of the fuse material that is more or less parallel to the substrate.

The ribbons that are formed typically have curved surfaces as a result of the etching, but the drawing figures show these ribbons with corners in order to simplify the showing of the technique of manufacture.

Following formation of the fuse ribbons 17, a mask pattern 21 of a photoresist is applied as shown in the plane view of FIG. 8. The mask pattern is formed with an oversize opening 20 where the fuses are to be located. The cross sectional views in FIGS. 9A, 9B, and 9C show this arrangement of the mask layer 21.

With this mask pattern 21, the conductive material 14 that is exposed through the openings 20 is etched in such a manner as to not substantially affect the fuse ribbons 17. This may be easily done with mixtures of phosphoric, nitric, and acetic acids which are commonly used for aluminum etching. Various commercially available and proprietary formations of these mixtures exist.

After etching the aluminum 14 through the mask openings 20 any barrier metal that is exposed is then etched without substantially affecting the fuse ribbons. This may be done in hydrogen peroxide, but an anisotropic dry etching can also be performed since the thickness of TiW in the horizontal direction is much less than the effective vertical thickness of the fuse ribbon 17. Because of this, it is also possible to use TiW as a fuse material as well as using a dry etch. Hydrogen peroxide for the barrier metal etch would overly etch TiW fuse ribbons since the etching would take place laterally, as well as vertically. After etching of the conductive material 14 is completed, the masks 21 are removed.

The completed structure of the fuse ribbons is shown in FIGS. 10, 11A, 11B, and 11C. In this arrangement, ribbons of the fuse material are illustrated in FIG. 11B as extending between conductive portions 14' and 14", as seen in FIG. 10. The cross-sectional areas A—A and C—C are void of conductive material in the center areas. In this arrangement, only the fuse material 17, shown in FIG. 11B, remains between the conductive portions 14' and 14".

Subsequent to this, where multiple levels of interconnects are used, such as illustrated in FIG. 1, then steps of dielectric deposition, planarization, via patterning, metal deposition, and subsequent patterning of the metal conductor layers are again carried out. The formation of fuse connectors 17 between these conductive portions at each interconnect level is then provided according to the present invention. Upon reaching a final interconnect level, deposition of passivation materials, such as silicon nitride and its subsequent patterning, may be carried out.

What I claim:

1. A method of manufacturing fusible links between conductors in a semiconductor device comprising the steps of:
    (a) providing a semiconductor device having a surface on at least one level with contact positions for conductors,
    (b) depositing at least a conductive metal layer on said surface to a given thickness,
    (c) forming a first masking pattern over said conductive metal layer with openings to define a pattern of conductive interconnects,
    (d) etching said conductive metal layer through said openings of said first masking pattern to form said pattern of conductive interconnects,
    (e) removing said first masking pattern,
    (f) depositing a fuse material over said pattern of conductive interconnects to a second given thickness,
    (g) anisotropically etching said fuse material to form ribbons of said fuse material at side edges of said pattern of conductive interconnects,
    (h) forming a second masking pattern over said pattern of conductive interconnects with said ribbons of said fuse material, said second masking pattern having openings at positions to locate said ribbons of said fuse material,
    (i) etching exposed portions of said pattern of conductive interconnects to leave only said ribbons of fuse material, and
    (j) removing said second masking patterns.

2. A method according to claim 1, wherein a layer of a barrier metal is deposited between said surface and said conductive metal layer during step (b).

3. A method according to claim 2, wherein said layer of barrier metal is etched into said pattern of conductive interconnects during step (d).

4. A method according to claim 3, wherein during said step (i) said barrier metal is also etched upon exposure.

5. A method according to claim 2, herein said barrier metal is formed of TiW.

6. A method according to claim 1, wherein said conductive metal layer is formed of an aluminum alloy.

7. A method according to claim 1, wherein said step (d) is carried out by using a plasma etch.

8. A method according to claim 1, wherein said fuse material is formed from a conductor.

9. A method according to claim 1, wherein said fuse material is formed of one of Ni, Ni-Cr, Cr, W, WN, Ti, TiW, TiWN, and TiN.

10. A method according to claim 1, wherein said step (g) is carried out by plasma etching or RIE.

11. A method according to claim 1, wherein said step (g) is carried out by ion milling.

12. A method according to claim 1, wherein said steps (b)-(j) are repeated for multiple levels of said semiconductor device.

13. A method according to claim 1, wherein said step (i) is carried out by one or more wet etches.

14. A method according to claim 1, wherein said step (i) is carried out by a combination of wet and dry etches.

* * * * *